United States Patent
Fan et al.

(10) Patent No.: US 9,806,086 B2
(45) Date of Patent: Oct. 31, 2017

(54) METHODS OF TUNNEL OXIDE LAYER FORMATION IN 3D NAND MEMORY STRUCTURES AND ASSOCIATED DEVICES

(71) Applicants: Darwin Fan, Boise, ID (US); Sateesh Koka, Santa Clara, CA (US); Gordon Haller, Boise, ID (US); John Hopkins, Boise, ID (US); Shyam Surthi, Boise, ID (US); Anish Khandekar, Boise, ID (US)

(72) Inventors: Darwin Fan, Boise, ID (US); Sateesh Koka, Santa Clara, CA (US); Gordon Haller, Boise, ID (US); John Hopkins, Boise, ID (US); Shyam Surthi, Boise, ID (US); Anish Khandekar, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/227,217

(22) Filed: Mar. 27, 2014

(65) Prior Publication Data

US 2015/0279851 A1    Oct. 1, 2015

(51) Int. Cl.
| | | |
|---|---|---|
| *H01L 29/788* | (2006.01) | |
| *H01L 27/11524* | (2017.01) | |
| *H01L 27/11556* | (2017.01) | |

(52) U.S. Cl.
CPC .. *H01L 27/11524* (2013.01); *H01L 27/11556* (2013.01)

(58) Field of Classification Search
CPC ............... H01L 29/7926; H01L 29/788; H01L 27/11556; H01L 29/66825;
(Continued)

(56) References Cited

U.S. PATENT DOCUMENTS 5,874,760 A * 2/1999 Burns, Jr. ......... H01L 27/10841
257/315
7,102,191 B2 * 9/2006 Forbes .......................... 257/315
(Continued)

FOREIGN PATENT DOCUMENTS

KR    10-2011-0034816 A    4/2011
KR    10-2012-0113596 A    10/2012

OTHER PUBLICATIONS

Lau et al, "A Model for Phosphorus Segregation at the Silicon-Silicon Dioxide Interface", Applied Physics, 1989, pp. 2, Springer-Verlag.
(Continued)

*Primary Examiner* — Marc Armand
*Assistant Examiner* — Sarah Salerno
(74) *Attorney, Agent, or Firm* — Thorpe North & Western, LLP; David W. Osborne

(57) ABSTRACT

3D NAND memory structures and related method are provided. In some embodiments such structures can include a control gate material and a floating gate material disposed between a first insulating layer and a second insulating layer, an interpoly dielectric (IPD) layer disposed between the floating gate material and control gate material such that the IPD layer electrically isolates the control gate material from the floating gate material, and a tunnel dielectric material deposited on the floating gate material opposite the control gate material.

20 Claims, 11 Drawing Sheets

(58) Field of Classification Search
CPC ......... H01L 27/11524; H01L 27/11578; H01L 27/0688; H01L 21/8221; H01L 27/11551; H01L 27/1157; H01L 21/762
See application file for complete search history.

(56) References Cited

U.S. PATENT DOCUMENTS

| | | | |
|---|---|---|---|
| 2002/0154556 A1* | 10/2002 | Endoh | H01L 27/115 365/200 |
| 2011/0147823 A1* | 6/2011 | Kuk | H01L 27/11551 257/324 |
| 2011/0266604 A1 | 11/2011 | Kim et al. | |
| 2012/0001247 A1* | 1/2012 | Alsmeier | 257/316 |
| 2012/0231593 A1 | 9/2012 | Joo et al. | |
| 2014/0045307 A1 | 2/2014 | Alsmeier et al. | |

OTHER PUBLICATIONS

Search Report for International application PCT/US2015/018138 dated Jun. 5, 2015, 11 pages.

\* cited by examiner

METHODS OF TUNNEL OXIDE LAYER FORMATION IN 3D NAND MEMORY STRUCTURES AND ASSOCIATED DEVICES

BACKGROUND

Memory structures are integrated circuits that provide data storage to a variety of electronics devices. Memory can include volatile memory structures that lose stored information when not powered (e.g., RAM-Random Access Memory), and non-volatile memory structure that retain stored information even when not powered. One example of such non-volatile memory is flash memory. Non-volatile flash memory can be used in a variety of portable devices, and can be beneficial for use when transferring data from one electronic device to another where power is not supplied during the physical transfer.

DESCRIPTION OF EMBODIMENTS

Figure 1A:
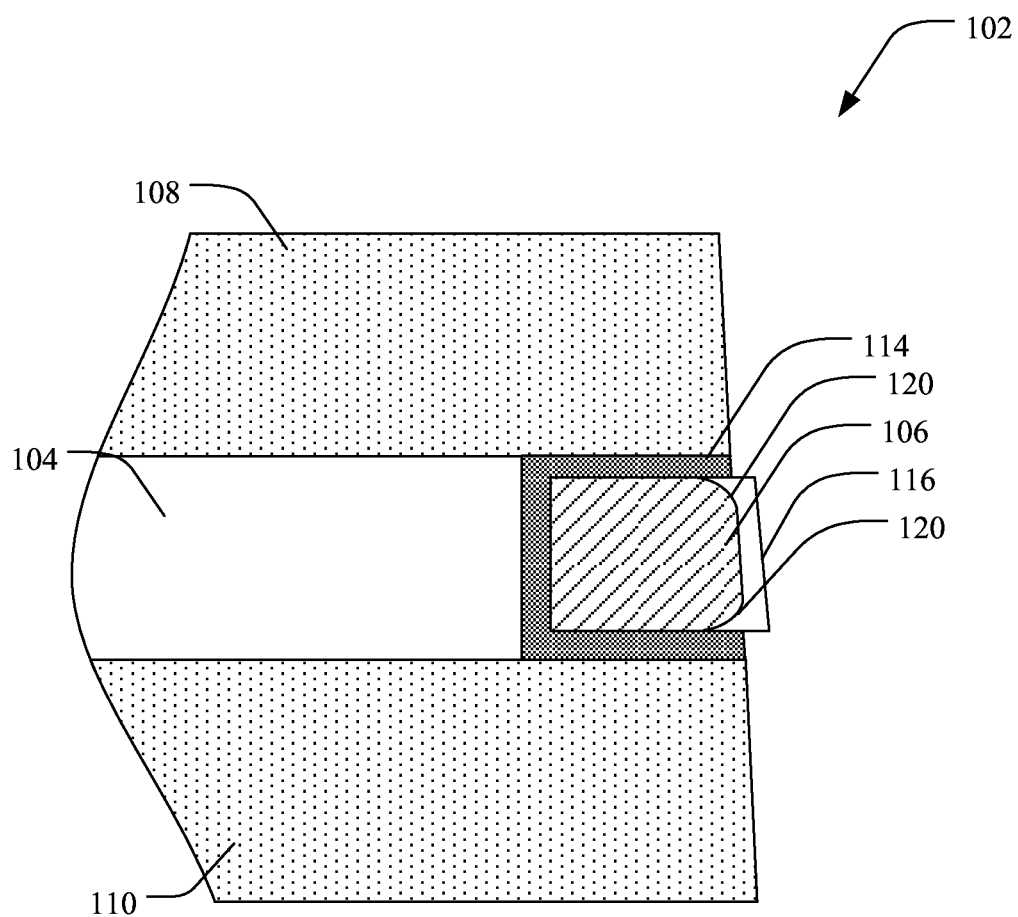
FIG. 1A is a schematic view of a section of a memory structure in accordance with the prior art.

Although the following detailed description contains many specifics for the purpose of illustration, a person of ordinary skill in the art will appreciate that many variations and alterations to the following details can be made and are considered to be included herein. Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms."

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Reference in this specification may be made to devices, structures, systems, or methods that provide "improved" performance. It is to be understood that unless otherwise stated, such "improvement" is a measure of a benefit obtained based on a comparison to devices, structures, systems or methods in the prior art. Furthermore, it is to be understood that the degree of improved performance may vary between disclosed embodiments and that no equality or consistency in the amount, degree, or realization of improved performance is to be assumed as universally applicable.

Example Embodiments

An initial overview of technology embodiments is provided below and specific technology embodiments are then described in further detail. This initial summary is intended to aid readers in understanding the technology more quickly, but is not intended to identify key or essential features of the technology, nor is it intended to limit the scope of the claimed subject matter.

3D NAND memory generally includes a plurality of memory cells that have floating-gate transistors. Present 3D NAND memory cells can include a plurality of NAND memory structures arranged in three dimensions around a central cell pillar. A memory structure can generally include a floating gate that is electrically isolated from a supporting semiconductor substrate by a thin dielectric layer called a tunnel dielectric layer. A conductive material is positioned adjacent to the floating gate and electrically isolated therefrom by an inter-poly dielectric (IPD) layer. The inter-poly dielectric can be a layered structure, and in some aspects can include a silicon nitride layer sandwiched between two layers of silicon oxide. The floating gate is generally comprised of a conductive material that serves as a charge storage element for electrical charge. This charge storage element defines the memory state of the particular transistor to which it is associated. The floating gate is electrically isolated from surrounding conductive materials, and thus charge stored therein remains even when power to the device is discontinued.

In various prior 3D NAND technologies, tunnel oxide layer formation is achieved by oxidizing directly on the floating gate. This has been discovered to create a number of undesirable effects, such as non-uniform oxide growth, contamination of the tunnel oxide layer with dopants from the floating gate, dopant gathering at the floating gate/tunnel oxide interface, and reduced floating gate size. One example of non-uniform oxide growth is shown in FIG. 1A. As can be seen, NAND memory structure 102 has a control gate material 104 and a floating gate material 106 disposed between first insulating layer 108 and second insulating layer 110. An interpoly dielectric (IPD) layer 114 is disposed between the control gate material 104 and the floating gate material 106, such that the IPD layer 114 electrically isolates the control gate material 104 from the floating gate material 106. The structure further includes a tunnel dielectric material or layer 116 which was formed by oxidizing directly on the floating gate material 106. As can be seen, the fact that the tunnel dielectric layer was grown on the floating gate 106 has caused rounded edges 120 creating a "smiling" profile or shape along the floating gate/tunnel oxide interface. Such shape contributes along with the above-recited characteristics to a reduced uniformity of electric field across the memory cell and therefore, reduced cell program and erase performance.

Accordingly, the above-recited disadvantages can be avoided by employing a process where a tunnel oxide layer is formed without growing the layer directly from the floating gate. In this way, the properties and characteristics of the floating gate, such as shape, size, and dopant distribution can be maintained as originally intended.

Figure 1B:
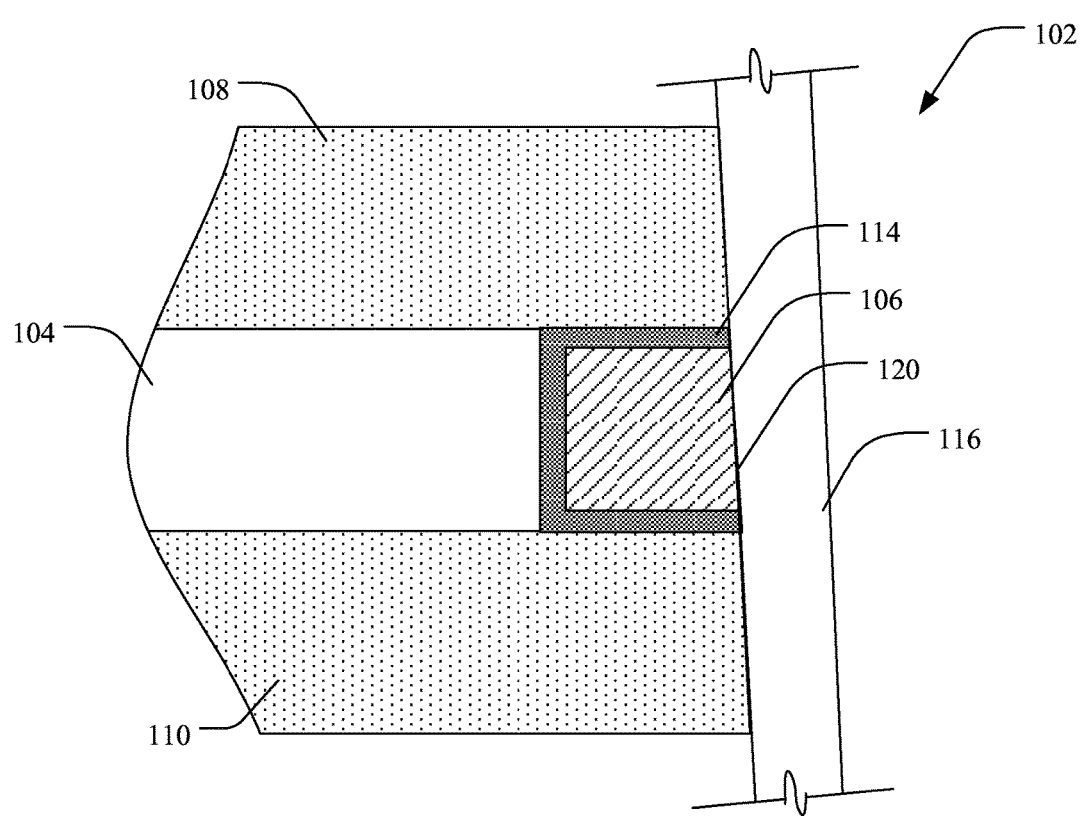
FIG. 1B is a schematic view of a section of a memory structure in accordance with an invention embodiment.

Referring to FIG. 1B, is shown a NAND memory structure 102 having an improved program and erase performance. The memory structure can include a control gate material 104 and a floating gate material 106 disposed between a first insulating layer 108 and a second insulating layer 110. An interpoly dielectric (IPD) layer 114 is disposed between the control gate material 104 and the floating gate material 106, such that the IPD layer 114 electrically isolates the control gate material 104 from the floating gate material 106. The structure further includes a tunnel dielectric material or layer 116 coupled to the floating gate material 106 opposite the control gate material 104. In some embodiments, the tunnel dielectric material 116 may be deposited on the floating gate material 106. As can be seen, by contrast to the memory structure of FIG. 1A, the floating gate 106 as shown in FIG. 1B does not have rounded corners at the floating gate/tunnel oxide interface, and no "smiling profile" or effect occurs.

As will be described in more detail herein, in some embodiments, the tunnel dielectric material 116 may be untreated following deposition on the floating gate material 106. In such instances, the tunnel dielectric material 116 as deposited will be a material that is effective to perform the function of a tunnel dielectric layer without further treatment. In other embodiments, the tunnel dielectric material 116 may be treated following deposition on the floating gate material 106. In such embodiments, the material deposited may or may not be suitable to function as a tunnel dielectric layer 116, but may become either suitable, or more suitable, upon treatment of the material after deposition on the floating gate 106. One example of such treatment is oxidation of the deposited material.

In addition to variation in the type of material deposited, the thickness of the material deposited may be varied as well. When a material that is suitable to act as a tunnel dielectric layer 116 without any post deposition treatment is used, the thickness of the tunnel dielectric material as deposited may be the thickness of the final tunnel dielectric layer. In one embodiment, the thickness of such material as deposited may be from about 50 to about 80 angstroms. In another embodiment, the thickness may be about 60 angstroms. In embodiments where the deposited material is to be further treated after deposition onto floating gate 106, the thickness of the material as deposited will take into account a desired thickness for the final tunnel dielectric layer 116, and any thickness fluctuations that may occur as a result of the post deposition treatment. In one embodiment, the thickness of the deposited material may be from about 25 angstroms to about 40 angstroms. In another embodiment, the thickness may be from about 60 angstroms to about 100 angstroms. In another embodiment, the thickness may be about 70 to about 80 angstroms.

A wide variety of materials may be used to create a tunnel dielectric layer 116 by deposition of a material that is sufficient to function as a tunnel dielectric layer without any post deposition treatment. Examples of such materials include without limitation, silicon dioxide, silicon oxynitride, and metal oxides. In one embodiment, the material may be silicon dioxide.

Likewise, a wide variety of materials that must undergo post deposition processing, or treatment, in order to serve as a tunnel dielectric layer 116 or to have performance improved as a tunnel dielectric layer may be used. Examples of such materials include without limitation, polysilicon (including undoped polysilicon) and silicon nitride. In one embodiment, the material may be polysilicon. As mentioned, such materials may be treated by oxidation or other treatments that render them suitable for use as a tunnel dielectric layer 116.

Figure 1C:
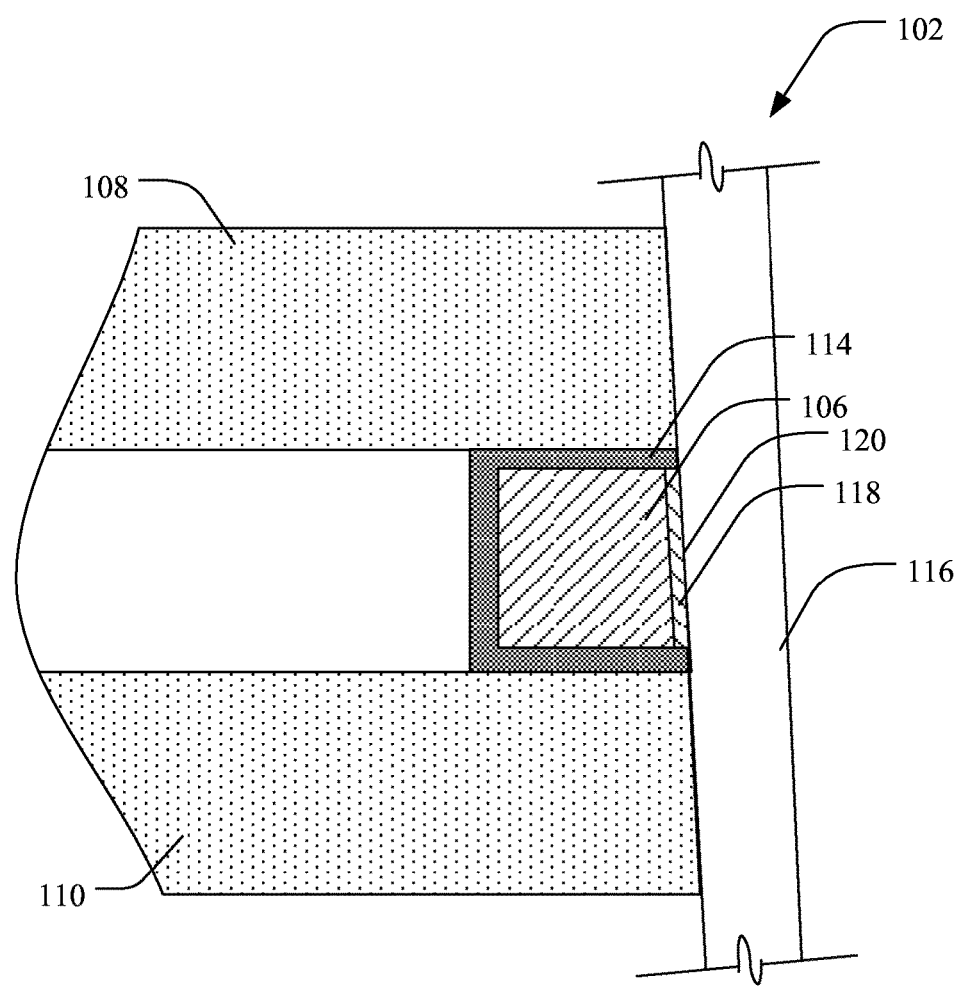
FIG. 1C is a schematic view of a section of a memory structure in accordance with an invention embodiment.

The degree to which the deposited material is oxidized or otherwise treated following deposition may be selected in order to obtain specifically desired characteristics or performance of the tunnel oxide layer 116 and moreover of the memory cell or structure 102. In one embodiment, the deposited material may be oxidized to a degree wherein the tunnel dielectric material layer 116 is less than fully or completely (i.e. partially) oxidized. In another embodiment, the deposited material may be oxidized to a degree wherein the tunnel dielectric material layer is fully or completely oxidized. In yet another embodiment, oxidation may proceed throughout the entire deposited material and also into a portion of the floating gate 106 that is in contact with the tunnel dielectric layer 116. Such embodiment is shown in FIG. 1C, where an oxidized portion 118 of the floating gate 106 is shown. In some embodiments, the portion of the floating gate that is oxidized is about 10 angstroms, or less than 10 angstroms, for example from about 1 angstrom to about 10 angstroms, from the original interface between the floating gate and the tunnel dielectric layer. Over-oxidation of the deposited material in this manner not only completes creation of the tunnel dielectric layer 116, but also effectively further insulates against potential current leakage by the floating gate 106.

As mentioned, the example memory structures have several physical characteristics that provide improved performance advantages. In one embodiment, an interface 120 between the floating gate 106 coupled to the tunnel dielectric layer 116 is substantially flat (i.e. contains no or substantially no appreciable warping or curving). In other words, the surface of the floating gate that forms the interface with the tunnel dielectric layer may have substantially the same shape and/or configuration as it had prior to formation or creation of the tunnel dielectric layer 116. In some embodiments, such surface extends along the entire interface between the floating gate 106 and the tunnel dielectric layer 116. In other embodiments, the floating gate 106 remains at substantially its original size as found just prior to formation or creation of the tunnel dielectric layer 116. In yet further embodiments, the tunnel dielectric layer 116 remains substantially free of dopant contamination from the floating gate after formation or creation of the tunnel dielectric layer. In further embodiments, the floating gate 106 has a dopant distribution following formation of the tunnel dielectric layer 116 that is substantially the same as it was prior to formation or creation of the tunnel dielectric layer 116. In some embodiments, the dopant distribution of the floating gate is substantially uniform. In yet further embodiments, the floating gate 106 has substantially the same shape after formation or creation of the tunnel dielectric layer 116 as it did prior thereto. In additional embodiments, an interface between the floating gate 106 and either the first or second insulating layers 108 and 110, may intersect or otherwise meet an interface between the floating gate 106 and tunnel dielectric layer 116, to form an angle of from about 20 degrees to about 160 degrees. In some embodiments, the angle may be from about 30 to about 60 degrees. In other embodiments, the angle may be from about 45 degrees to about 120 degrees. In further embodiments, the angle may be from about 30 degrees to 80 degrees. In one embodiment, the angles may be substantially the same. In another embodiment, the angles may be different. In yet another embodiment, the floating gate 106 may have height and width dimensions at a side adjacent to the tunnel dielectric layer 116 (i.e. an interface therewith) that is substantially the same as height and width dimensions at a side adjacent to the IPD layer 114 (i.e. an interface therewith). In another embodiment, the width of the floating gate 116 may be substantially the same along an interface with the first insulting layer 108 as its width along an interface with the second insulating layer 110. In one embodiment, the floating gate 106 may be substantially free of curved surfaces.

Figure 2:
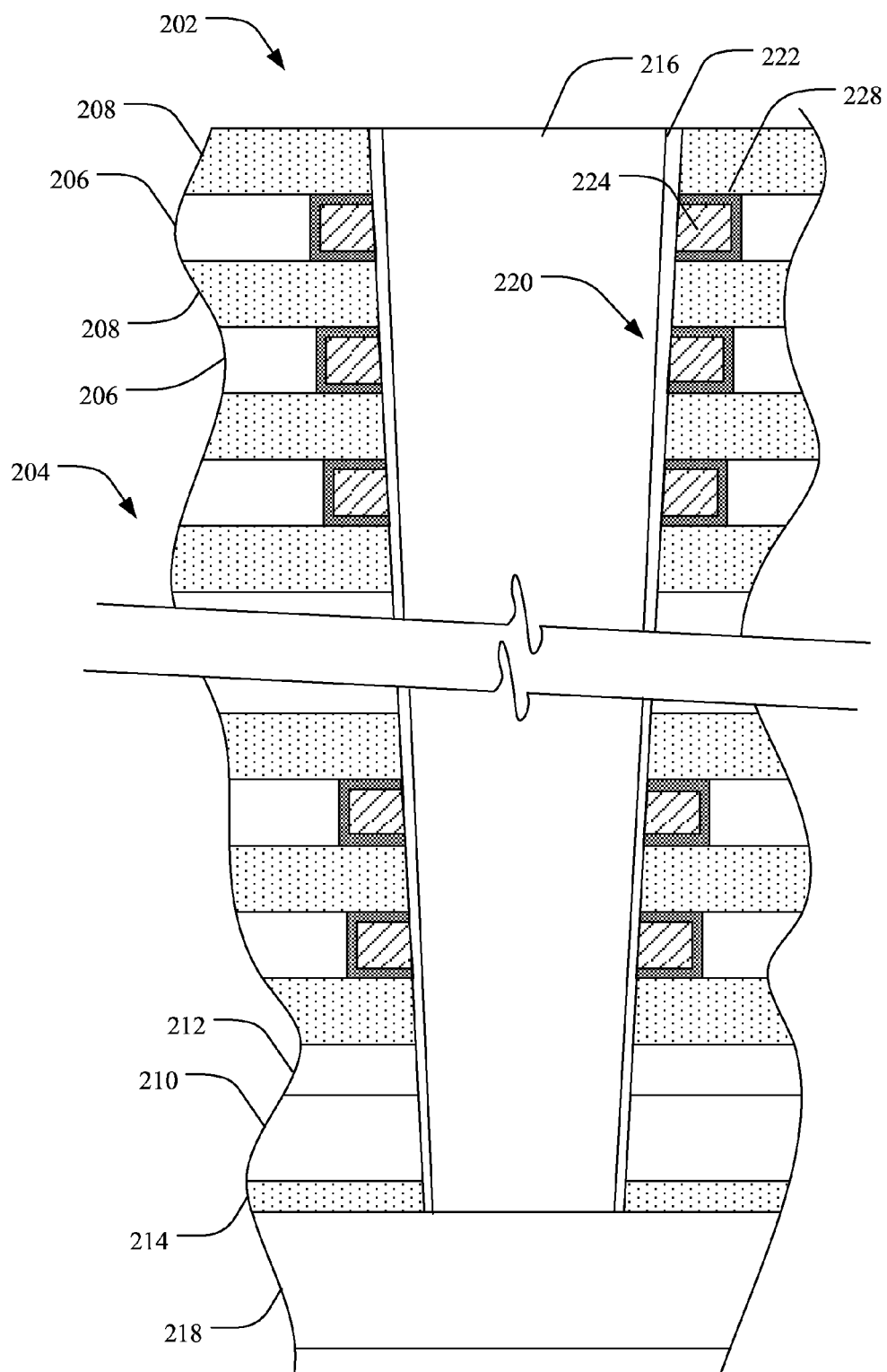
FIG. 2 is a schematic view of a section of a 3D NAND memory cell in accordance with an invention embodiment.

Such NAND memory structures can be used as a single NAND device, or the memory structure can be incorporated into a device that incorporates a plurality of such structures. Furthermore, the particular architectural layouts described herein should not be seen as limiting, and it is to be understood that other architectures are contemplated for integrating a plurality of such memory structures into a device. In one aspect, as is shown in FIG. 2 for example, a 3D NAND memory cell 202 having an improved performance is provided. Such a memory cell can include a cell stack substrate 204 having alternating layers of conducting 206 and insulating 208 materials disposed on a select gate source (SGS) region 210. In some aspects, the SGS region is disposed between an etch stop layer 214 and an additional insulating layer 212. A cell pillar 216 can be positioned within the cell stack substrate 204 in a substantially perpendicular orientation with respect to the plurality of alternating layers 206, 208. The cell pillar extends through the SGS region into an underlying source layer 218. Furthermore, a plurality of NAND memory structures 220 are arranged in a three dimensional configuration around the cell pillar 216. The plurality of NAND memory structures 220 are aligned with respect to the conductive material layers 206 of the cell stack substrate 204. In one aspect the conductive material layers 206 can function as control gate material, while in other aspects a separate control gate material can be positioned between the conductive material layer and the NAND memory structure.

A tunnel dielectric material 222 can be positioned between the cell stack substrate 204 and the cell pillar 216, thus electrically isolating the NAND memory structures 220 from the cell pillar 216. Each NAND memory structure includes a floating gate material 224 disposed between insulating material layers 208 and aligned with a conductive material layer 206. An interpoly dielectric (IPD) layer 228 is disposed between the floating gate 224 and the conductive material layer 206 such that the IPD layer 228 electrically isolates the conductive material layer 206 from the floating gate material 224. As can be seen, the memory structures include the desirable characteristics previously recited.

Figure 3:
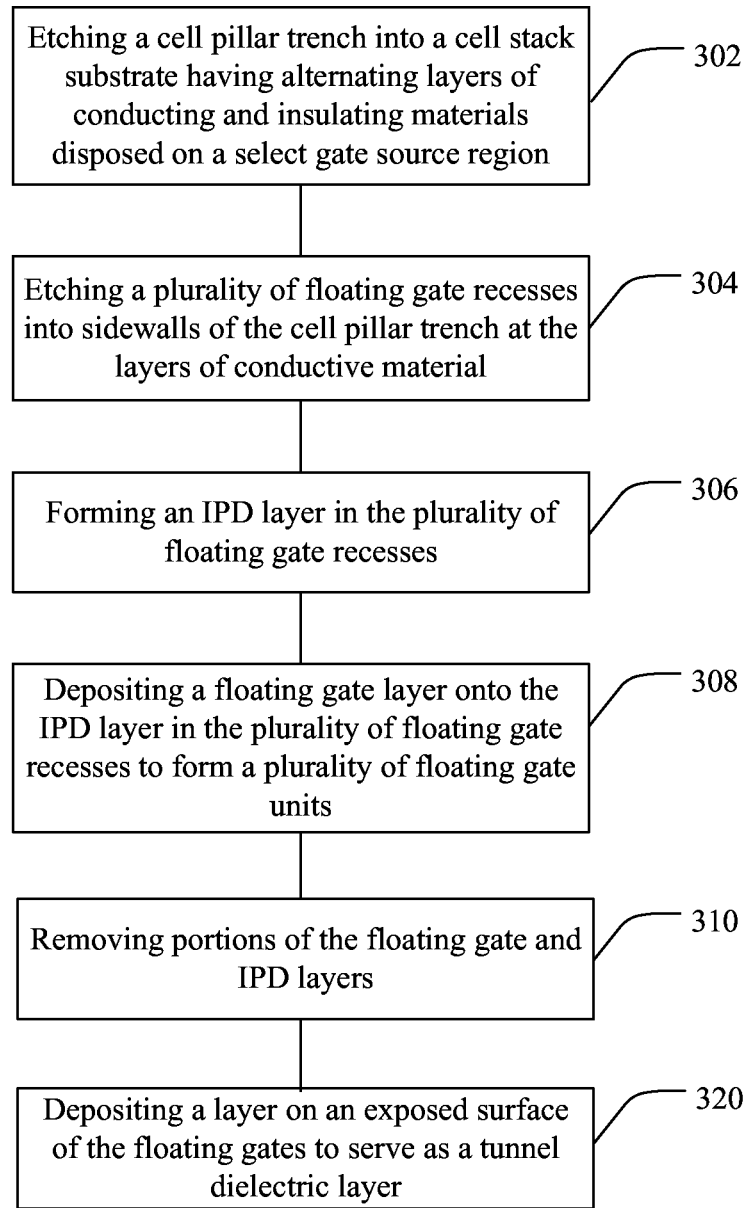
FIG. 3 is a flow diagram of a method of making a 3D NAND memory cell in accordance with an invention embodiment.

In another aspect, methods of making 3D NAND memory structures having enhanced performance, such as improved reliability of program and erase operations are provided. As is shown in FIG. 3, in one embodiment such a method can include 302 etching a cell pillar trench into a cell stack substrate having alternating layers of conducting and insulating materials disposed on a select gate source region, 304 etching a plurality of floating gate recesses into sidewalls of the cell pillar trench at the layers of conductive material, and 306 forming an interpoly dielectric (IPD) layer in the plurality of floating gate recesses. The method can further include 308 depositing a floating gate layer onto the IPD layer in the plurality of floating gate recesses to form a plurality of floating gate units and 310 removing portions of the IPD and floating gate layers from off of the insulating layers to create discrete floating gate structures. The method can then include 320 depositing a layer on an exposed surface of the floating gate units (i.e. exposed surface of the floating gate material) to serve as a tunnel oxide dielectric layer.

At a more basic level, methods of forming a tunnel dielectric layer in a 3D NAND memory structure are provided. In one embodiment, such a method may include depositing a layer on an exposed surface of a floating gate material in a cell stack substrate. Such layer can either operate as the tunnel dielectric layer without further treatment thereof, or operate as a tunnel dielectric layer after further treatment or processing. In some embodiments, additional steps may be performed in order to achieve memory structures and devices having the characteristics and properties recited herein.

Figure 4A:
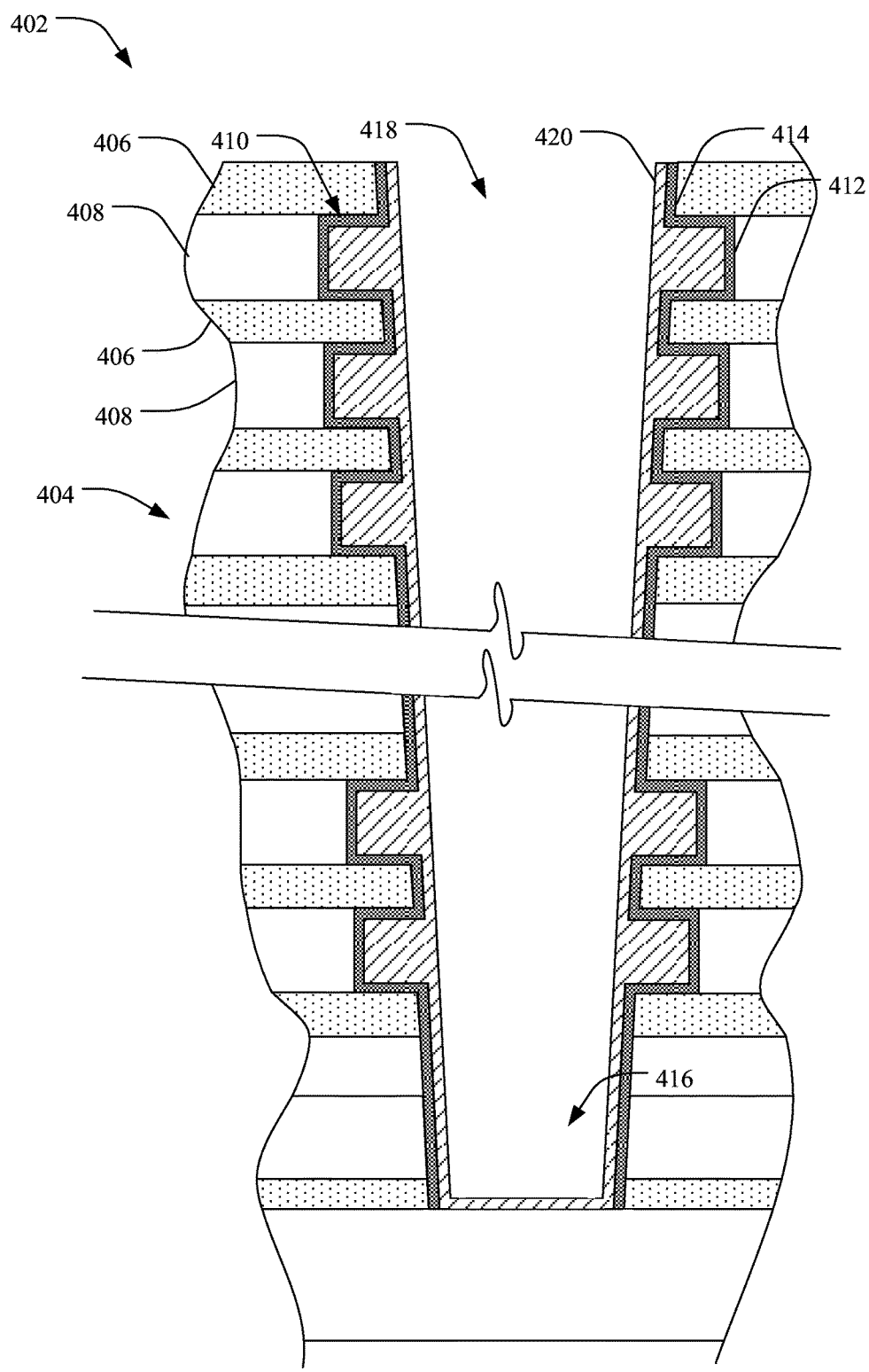
FIG. 4A is a schematic view of a section of a 3D NAND memory cell during manufacture in accordance with an invention embodiment.

By way of example, as is shown in FIG. 4A, a 3D NAND memory structure 402 is shown in the process of being made. A cell pillar trench 418 has been etched into a cell stack substrate 404. The cell stack substrate 404 includes a plurality of alternating insulating 406 and conducting 408 material layers. A plurality of floating gate recesses 410 have been etched into the sidewalls of the cell pillar trench 404 at the conductive material layers 408. Thus the floating gate recesses 410 are isolated from one another by the insulating material layers 406. An IPD layer 412 has been formed in the floating gate recesses 410. In some aspects the IPD layer is formed along the sidewalls 414 of the cell pillar trench 418, and thus forms a continuous IPD layer from the bottom 416 of the cell pillar trench 418 to the top. In other aspects, the IPD layer can be discontinuous at this or a subsequent stage of manufacture. The IPD layer has been further etched to allow floating gate recesses 410 that accommodate deposition of the floating gate materials as will be discussed. The IPD layer can be made of any known material useful for such a material. In one aspect the IPD layer can be a layered structure comprised of a silicon nitride layer disposed between two layers of silicon oxide. This tri-layer is known in the art as an "ONO" or "Oxide-Nitride-Oxide" layer. Note that the IPD layer 412 is positioned to electrically isolate materials subsequently deposited into the floating gate recess 410 from the conducting material layer 408.

FIG. 4A also shows a floating gate layer (or material) 420 deposited on the IPD layer 414, and filling the floating gate recesses 410. In some aspects the floating gate layer 420 is deposited along the IPD layer 414 from the bottom 416 to the top of the cell pillar trench 418, and thus forms a continuous layer. In other embodiments the floating gate layer can be discontinuous at this or a subsequent stage of manufacture. It is noted that the floating gate material can be any material useful in creating a floating gate, including those recited herein. In one specific aspect, the floating gate material can be a doped silicon or polysilicon.

Figure 4B:
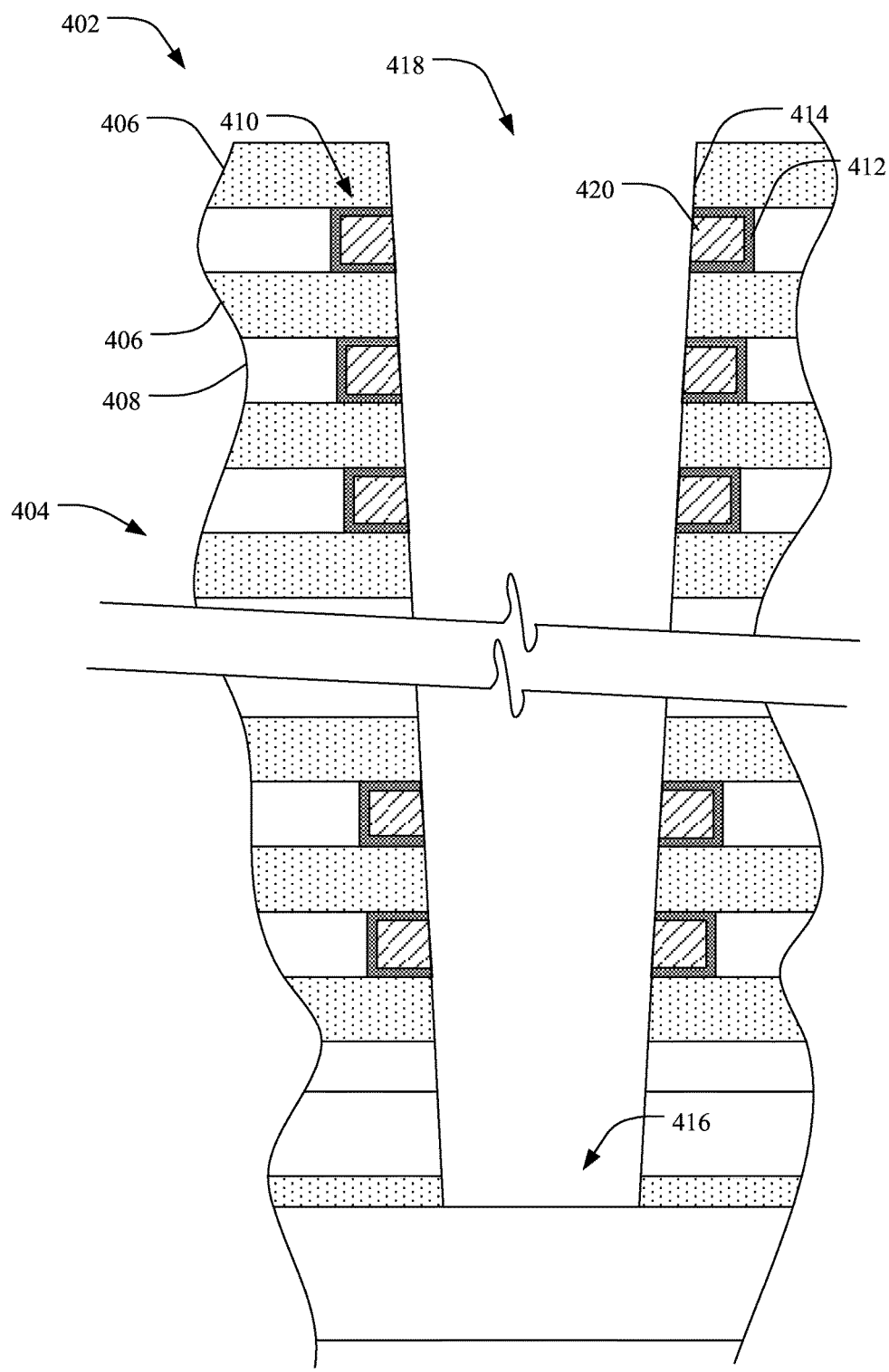
FIG. 4B is a schematic view of a section of a 3D NAND memory cell during manufacture in accordance with an invention embodiment.

Turning to FIG. 4B, the IPD layer 412 and the floating gate layer 420 can be removed from the sidewalls and, if present, bottom 416 of the cell pillar trench 418. The IPD layer 412 and the floating gate layer 420 can be removed by any process known to be suitable for removal of such layers. In one example, the layers are selectively etched according to any process that selectively etches one or both of these materials without etching the underlying conductive and insulating material layers 406 and 408. Various wet and dry cleaning methods are known in the art. In some embodiments, a dry etching or cleaning process can be used such as, without limitation, a plasma-free gas chemical etch system targeted at selective oxide film etching using a Certas machine available from Tokyo Electron Limited (TEL) of Japan, or a SiCoNi etching process using a machine from Applied Materials of Santa Clara, Calif. using HF+NH3 vapor/HF+NH3 plasma. In one specific aspect, the floating gate material 420 can be etched with TMAH (Tetramethyl-ammonium hydroxide) from 0.1% to 30% in the temperature of 10 C to 100 C. In another specific aspect, the floating gate material 420 can be etched with NH4OH from 0.1 wt % to 20 wt %. One exemplary chemistry includes <10% TMAH, <2% of a nonionic surfactant, pH buffers for a range of 8-10, and optional chelating and/or complexing agents. Other chemistries include HNO3/HF mixtures in ratios from 1:1 to 300:1.

As depicted in FIG. 4B, IPD layer 412 and the floating gate layer 420 are etched away to expose the sidewalls 414 of the cell pillar trench 418. In this embodiment, the IPD layer 412 and the floating gate material are removed to the point where they are flush, or substantially flush, with the sidewalls 414. In other embodiments the floating gate materials 420 and/or the IPD materials 412 may be recessed from the sidewalls 414 of the pillar trench 418. The degree of recess may be selected so as to obtain a specifically desired result, such as additional insulation of the floating gate to reduce or prevent possible current leakage. An alternate solution to such issue as previously discussed is to oxidize a small portion of the floating gate materials at an interface with the tunnel oxide layer.

Figure 4C:
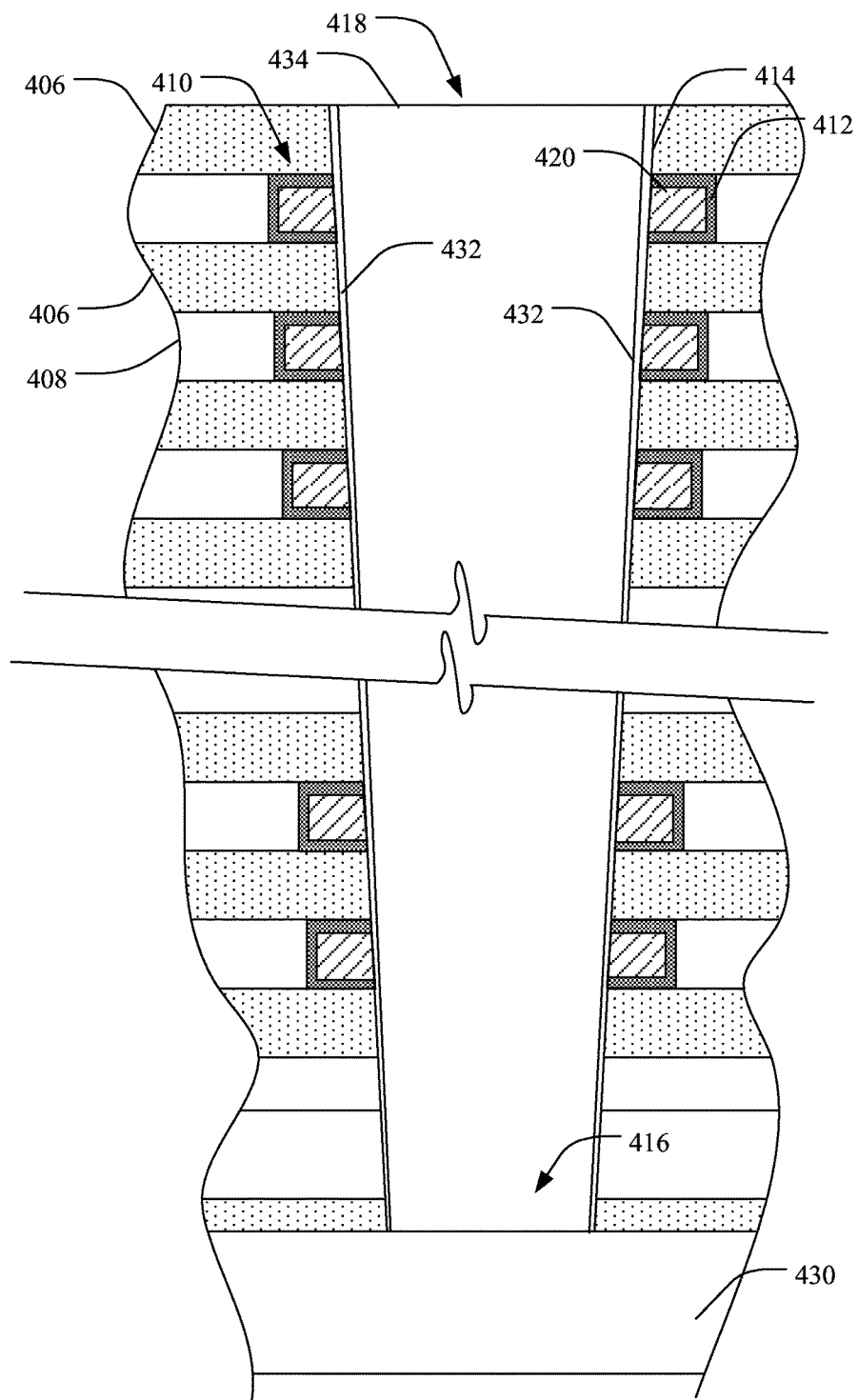
FIG. 4C is a schematic view of a section of a 3D NAND memory cell during manufacture in accordance with an invention embodiment.

As shown in FIG. 4C, a material to serve as a tunnel dielectric layer 432 can be coupled to, for example deposited along the sidewalls 414 of the trench. As previously mentioned, in one aspect, the material deposited may be sufficient to operate as a tunnel dielectric material without further post-deposition processing. Alternatively, the material may operate as a tunnel dielectric layer, or operate better as a dielectric layer, upon post-deposition treatment or processing of the material. Examples of specific materials and of other properties of the tunnel dielectric layer 432, such as dimensions, for each of these alternatives are recited herein.

In the process where a material is used that does not require any post-deposition processing in order to function as a tunnel dielectric layer 432, the remaining steps of the process for completing the memory structure can proceed as generally known. For example, following deposition (i.e. formation) of the tunnel dielectric layer 432, a liner layer (not shown) can be formed on the tunnel dialectic layer 432 and the bottom 416 of the cell pillar trench 418 can be punch-etched through the liner layer and the tunnel dielectric layer 432 to expose the source layer 430. A cell pillar 434 can subsequently be deposited into and thus fill the cell pillar trench 418. In one non-limiting aspect, the cell pillar 434 can be a polysilicon material. Alternatively, when a material that does require post-deposition treatment in order to function as a tunnel oxide dielectric layer 432 such treatment may be performed prior to the final steps for creating a complete memory structure as previously recited.

Figure 5:
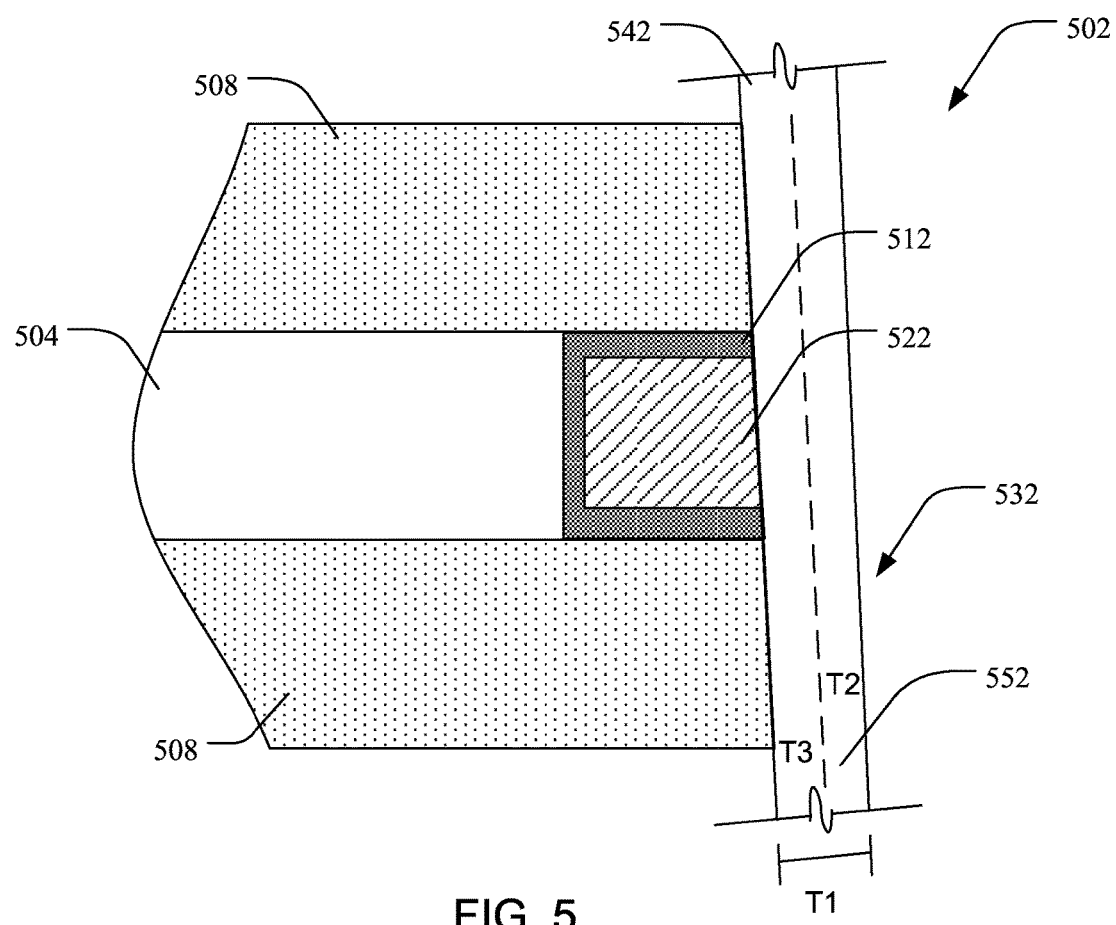
FIG. 5 is a schematic view of a section of a 3D NAND memory cell during manufacture in accordance with an invention embodiment.

Examples of such post-deposition treatment are as follows. Referring to FIG. 5, is shown an embodiment of a memory cell 502 with a conductive layer 504 and floating gate 522 arranged between insulating layers 508. IPD layer 512 is disposed between the conductive layer 504 and the floating gate 522. A layer of deposited material 532 is to be further treated or processed to become a suitable tunnel dielectric layer 542. In this embodiment, the material 532 is deposited at a thickness of within T1, in some embodiments the thickness may be less than T1. A portion of the material 532 is treated, for example, by oxidation. Oxidation will thicken the layer to the full thickness of T1 with the oxidized portion 552 having a thickness of T2. The oxidized portion 552 of the layer can then be removed, for example, by etching with a hydrofluoric acid etching process. The remaining portion of the material layer 532 is then further treated (i.e. oxidized) in order to create a tunnel dielectric layer 542 having a specifically desired thickness (i.e. T3). In one embodiment, the thickness of the deposited material prior to treatment may be from about 60 angstroms to about 100 angstroms.

In an alternative embodiment, the layer of deposited material 532 may be a material that is further treated in order to serve as an effective tunnel dielectric layer, but which is deposited at a thickness that does not require the entire process described above. In such embodiment, the deposited material 532 will have a thickness of within T1. Treatment of the material, such as by oxidation will result in creation of a tunnel dielectric layer 542 with a desired thickness of T3. Because the layer of deposited material 532 was sufficiently thin as deposited, the treatment of the material to become tunnel dielectric layer 542 was accomplished in a single step and did not require the intermediate steps of oxidizing a portion of the material 532 followed by removal thereof as described in the previous example. In one embodiment, the thickness of the deposited material prior to treatment may be from about 25 angstroms to about 40 angstroms.

In yet an additional embodiment, the material 532 deposited may be a material that does not require additional treatment to function or operate as a suitable tunnel dielectric layer 542. In such cases, the material will be deposited with a thickness of T3, which is the thickness of the final tunnel dielectric layer. In some embodiments, such thickness can be from about 50 angstroms to about 80 angstroms.

In any of the above-recited processes, as previously recited, the finished tunnel dielectric layer 542 may have a thickness (i.e. T3) of from about 50 angstroms to about 80 angstroms. In one embodiment, the thickness may be about 60 angstroms. As mentioned above, in embodiments where the deposited material 532 is treated, for example by oxidation, the treatment can proceed through the entire layer 542 and into a portion of the floating gate material 522.

Figure 6:
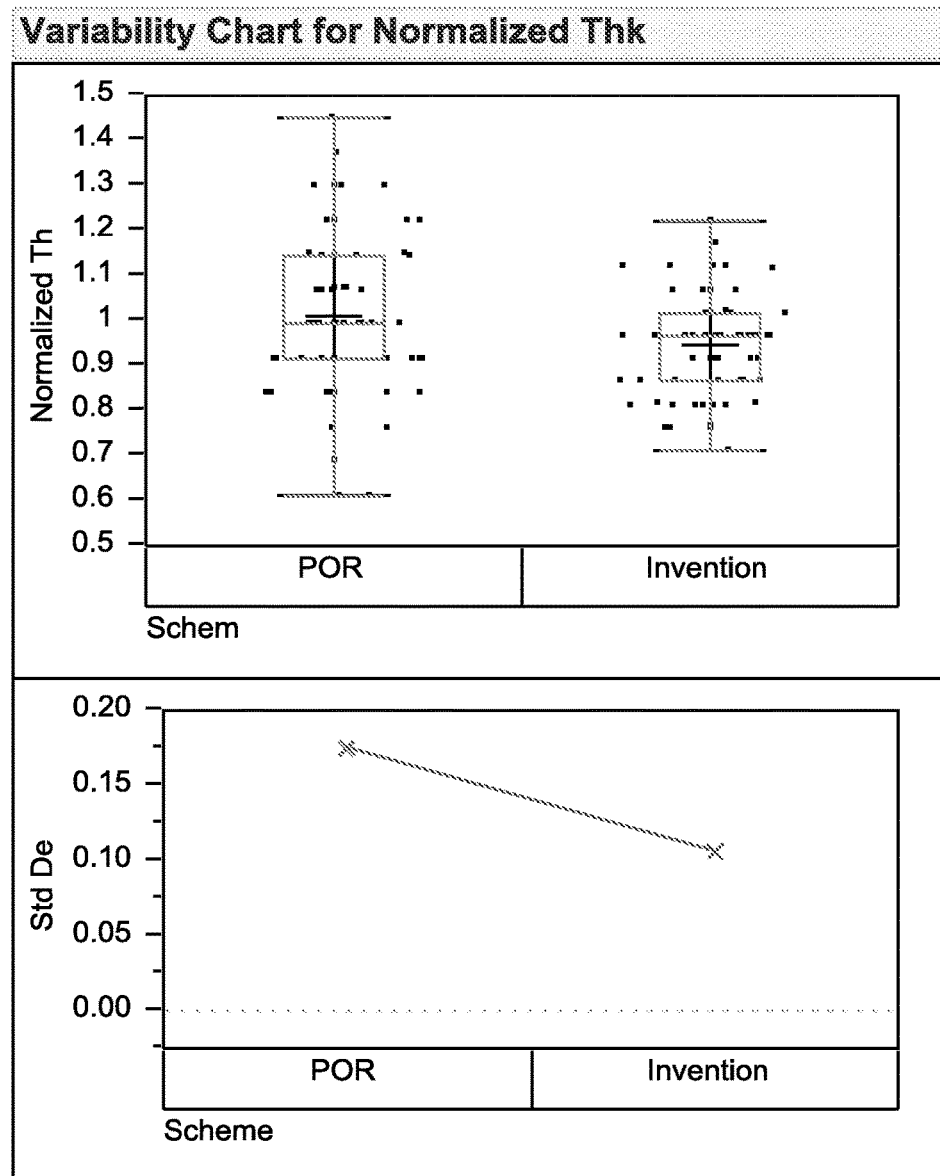
FIG. 6 is a box plot and graph of data collected comparing tunnel dielectric thicknesses obtained with invention embodiments as compared to known processes.
Figure 7:
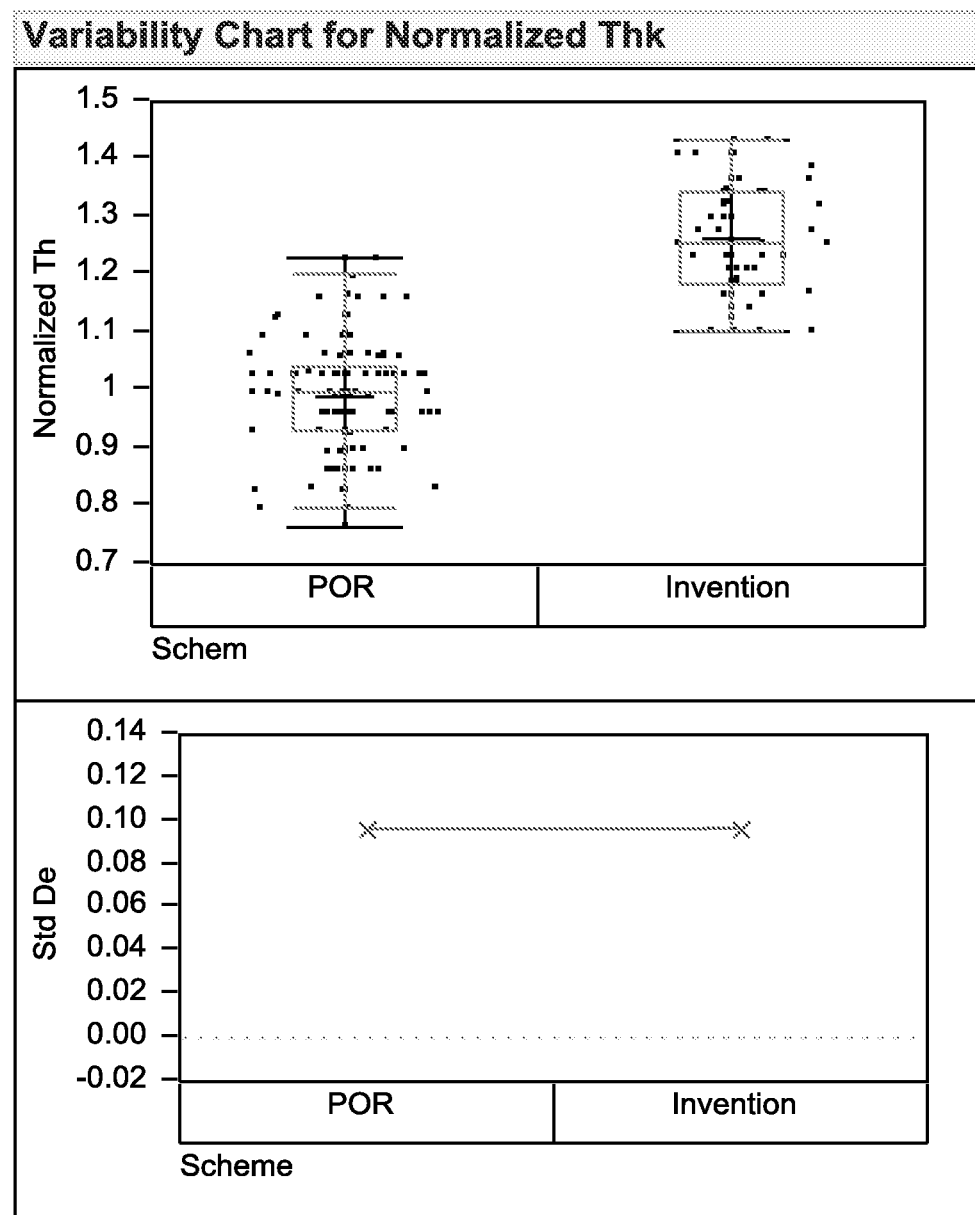
FIG. 7 is a box plot and graph of data collected comparing floating gate size obtained with invention embodiments as compared to known processes.

Resulting devices can demonstrate a variety of improved performance characteristics, which can be attributed, at least in part, to the process of forming a tunnel dielectric layer as recited herein and the specific structural characteristics provided thereby. Referring to FIG. 6 is shown box plots and graphical comparison of tunnel dielectric layer thickness achieved by invention embodiments as compared to a known process of record (POR). As can be seen, processes according to invention embodiments achieved greater thickness consistency as shown by the tightly grouped data points. Likewise, FIG. 7 shows box plots with data regarding the size of floating gates obtained with invention embodiments as compared to the known process of record (POR). As can be seen, processes according to invention embodiments resulted in larger floating gates (i.e. preserved the size of the floating gates) than compared to the POR.

In one example, a method of forming a tunnel dielectric layer in a 3D NAND memory structure may include depositing a layer of material on an exposed surface of a floating gate in a cell stack substrate, wherein said material either operates as the tunnel dielectric layer without further treatment, or operates as the tunnel dielectric layer after further treatment of the material.

In one example, the material is sufficient to operate as a tunnel dielectric layer without additional treatment.

In one example, the material is deposited at a thickness sufficient to operate as a tunnel dielectric layer.

In one example, the thickness is from about 50-80 angstroms.

In one example, the material is a member selected from the group consisting of: silicon dioxide, silicon oxynitride, or a metal oxide.

In one example, the material is silicon dioxide.

In one example, the material deposited is a material that operates as a tunnel dielectric layer after further treatment.

In one example, the material is deposited at a thickness sufficient to operate as a tunnel dielectric layer following further treatment of the material.

In one example, further treatment consists of oxidizing the material.

In one example, the thickness of the deposited material is from about 25 angstroms to about 40 angstroms and the thickness of the tunnel dielectric layer is from about 50 angstroms to about 80 angstroms.

In one example, further treatment can include oxidizing a portion of the material in the layer; removing the oxidized portion of the material in the layer; and oxidizing the remaining material in the layer.

In one example, the thickness of the deposited material is from about 60 angstroms to about 70 angstroms and the thickness of the tunnel dielectric layer is from about 50 angstroms to about 80 angstroms.

In on example, the oxidized portion of the material in the layer is removed using a hydrofluoric acid etch.

In one example, the material is a member selected from the group consisting of: undoped polysilicon, polysilicon, or silicon nitride.

In one example, the material is undoped polysilicon.

In one example, the layer is a continuous layer extending from a top of the cell stack substrate to a bottom of the cell stack substrate.

In one example, the layer is deposited only on the floating gate material

In one example, a method may include further comprising oxidizing a portion of the floating gate along an interface with the tunnel dielectric layer.

In one example, the portion of the floating gate that is oxidized is about 10 angstroms or less beyond the tunnel dielectric layer interface.

In one example, the floating gate is substantially flush with an exposed surface of the cell stack substrate at the time the layer is deposited.

In one example, the floating gate has a size following creation of the tunnel dielectric layer that is substantially the same as a size prior to creation of the tunnel dielectric layer.

In one example, the tunnel dielectric layer remains substantially free of dopant contamination from the floating gate.

In one example, the floating gate maintains a substantially uniform dopant distribution after formation of the tunnel dielectric layer.

In one example, the floating gate maintains substantially a same shape after formation of the tunnel dielectric layer.

In one example, the floating gate maintains substantially a same size (for example, volume) after formation of the tunnel dielectric layer.

In one example, a method of making a 3D NAND memory structure may include:

etching a cell pillar trench into a cell stack substrate having alternating layers of conducting and insulating materials disposed on a select gate source region;

etching a plurality of floating gate recesses into sidewalls of the cell pillar trench at the layers of conductive material;

forming an interpoly dielectric (IPD) layer in the plurality of floating gate recesses;

depositing a floating gate layer onto the IPD layer in the plurality of floating gate recesses to form a plurality of floating gate units;

etching the IPD layer and the floating gate layer to be flush with the sidewalls of the cell pillar trench and create a discrete floating gate; and forming a tunnel dielectric layer on an exposed surface of the floating gate as recited herein.

In one example, a 3D NAND memory structure can include:

a control gate material and a floating gate material disposed between a first insulating layer and a second insulating layer;

an interpoly dielectric (IPD) layer disposed between the control gate material and the floating gate material such that the IPD layer electrically isolates the control gate material from the floating gate material; and a tunnel dielectric layer deposited on the floating gate material opposite the control gate material.

In one example, the tunnel dielectric layer has a thickness of from about 50 angstroms to about 80 angstroms.

In one example, the material is a member selected from the group consisting of: silicon dioxide, silicon oxynitride, or a metal oxide.

In one example, the material is silicon dioxide.

In one example, a portion of the floating gate along an interface with the tunnel dielectric layer is oxidized.

In one example, the portion of the floating gate that is oxidized is about 10 angstroms or less beyond the tunnel dielectric layer interface.

In one example, the floating gate is substantially free of curved interfaces.

In one example, an interface between the floating gate and tunnel dielectric layer is substantially flat.

In one example, the floating gate has a size that is substantially the same as a size prior to creation of the tunnel dielectric layer.

In one example, the tunnel dielectric layer is substantially free of dopant contamination from the floating gate.

In one example, the floating gate has a substantially uniform dopant distribution.

In one example, the floating gate has a shape that is substantially the same as a shape prior to creation of the tunnel dielectric layer.

In one example, the floating gate has a height at an interface with the tunnel dielectric layer that is substantially the same as a height at an interface with the IPD layer.

In one example, a 3D NAND memory structure can include:

a control gate material and a floating gate material disposed between a first insulating layer and a second insulating layer;

an interpoly dielectric (IPD) layer disposed between the control gate material and the floating gate material such that the IPD layer electrically isolates the control gate material from the floating gate material; and a tunnel dielectric layer coupled to the floating gate material opposite the control gate material, wherein the floating gate is substantially free of curves at an interface with the tunnel dielectric layer.

In one example, the floating gate is substantially flat at an interface with the tunnel dielectric layer.

In one example, the floating gate is substantially flat along the entire interface with the tunnel dielectric layer.

In one example, an intersection of an interface between the floating gate and the first insulating layer and an interface between the floating gate and the tunnel dielectric layer has an angle of from about 20 degrees to about 160 degrees.

In one example, the angle is from about 45 degrees to 120 degrees.

In one example, an intersection of an interface between the floating gate and the second insulating layer and an interface between the floating gate and the tunnel dielectric layer has an angle of from about 20 degrees to about 160 degrees.

In one example, the angle is from about 45 degrees to 120 degrees.

In one example, a 3D NAND memory cell may include:
a cell stack substrate having alternating layers of conducting and insulating materials disposed on a select gate source region;
a cell pillar positioned within the substrate in a substantially perpendicular orientation with respect to the plurality of alternating layers; and
a plurality of NAND memory structures as recited herein arranged in a three dimensional configuration around the cell pillar, wherein the plurality of NAND memory structures are aligned with and electrically coupled to the conductive material layers.

In one example, the plurality of NAND memory structures are arranged in columns around the cell pillar.

While the forgoing examples are illustrative of the specific embodiments in one or more particular applications, it will be apparent to those of ordinary skill in the art that numerous modifications in form, usage and details of implementation can be made without departing from the principles and concepts articulated herein. Accordingly, no limitation is intended except as by the claims set forth below.

What is claimed is:

1. A 3D NAND memory structure comprising:
a control gate and a floating gate disposed between a first insulating layer and a second insulating layer;
an interpoly dielectric (IPD) layer disposed between the control gate and the floating gate such that the IPD layer electrically isolates the control gate from the floating gate; and
a tunnel dielectric layer disposed on the floating gate opposite the control gate, wherein the floating gate comprises an oxidized portion along an interface with the tunnel dielectric layer.

2. The memory structure of claim 1, wherein the portion of the floating gate that is oxidized is about 10 angstroms or less beyond the tunnel dielectric layer interface.

3. The memory structure of claim 1, wherein the floating gate is substantially free of curved interfaces.

4. The memory structure of claim 1, wherein an interface between the floating gate and tunnel dielectric layer is substantially flat.

5. The memory structure of claim 1, wherein the floating gate has a size that is substantially the same as a size prior to creation of the tunnel dielectric layer.

6. The memory structure of claim 1, wherein the tunnel dielectric layer is substantially free of dopant contamination from the floating gate.

7. The memory structure of claim 1, wherein the floating gate has a substantially uniform dopant distribution.

8. The memory structure of claim 1, wherein the floating gate has a shape that is substantially the same as a shape prior to creation of the tunnel dielectric layer.

9. The memory structure of claim 1, wherein the floating gate has a height at an interface with the tunnel dielectric layer that is substantially the same as a height at an interface with the IPD layer.

10. A method of forming a tunnel dielectric layer in a 3D NAND memory structure comprising:
depositing a layer of material on an exposed surface of a floating gate in a cell stack substrate;
over-oxidizing the layer of material to form the tunnel dielectric layer while also
oxidizing a portion of the floating gate along an interface with the tunnel dielectric layer.

11. The method of claim 10, wherein the material is deposited at a thickness sufficient to operate as a tunnel dielectric layer.

12. The method of claim 11, wherein the thickness is from about 50-80 angstroms.

13. The method of claim 10, wherein the material is a member selected from the group consisting of polysilicon and silicon nitride.

14. The method of claim 10, wherein the material is deposited at a thickness sufficient to operate as a tunnel dielectric layer following oxidation of the material.

15. The method of claim 10, wherein the thickness of the deposited material is from about 25 angstroms to about 40 angstroms and the thickness of the tunnel dielectric layer is from about 50 angstroms to about 80 angstroms.

16. The method of claim 10, wherein over-oxidizing the material to form the tunnel dielectric layer comprises:
oxidizing a portion of the material in the layer;
removing the oxidized portion of the material in the layer; and
oxidizing the remaining material in the layer.

17. The method of claim 16, wherein the thickness of the deposited material is from about 60 angstroms to about 70 angstroms and the thickness of the tunnel dielectric layer is from about 50 angstroms to about 80 angstroms.

18. The method of claim 10, wherein the portion of the floating gate that is oxidized is about 10 angstroms or less beyond the tunnel dielectric layer interface.

19. The method of claim 18, wherein the floating gate is substantially flush with an exposed surface of the cell stack substrate at the time the layer is deposited.

20. The method of claim 10, wherein the material does not function as a tunnel dielectric before the oxidizing.

* * * * *